United States Patent [19]

Tawada et al.

[11] Patent Number: 4,869,976
[45] Date of Patent: Sep. 26, 1989

[54] PROCESS FOR PREPARING SEMICONDUCTOR LAYER

[75] Inventors: Yoshihisa Tawada; Takeo Okamoto; Kazunori Tsuge, all of Kobe, Japan

[73] Assignee: Kanegafuchi Kagaku Kogyo Kabushiki Kaisha, Osaka, Japan

[21] Appl. No.: 653,007

[22] Filed: Sep. 21, 1984

[30] Foreign Application Priority Data

Sep. 21, 1983 [JP] Japan .................................. 58-174759

[51] Int. Cl.⁴ .............................................. B05D 3/06
[52] U.S. Cl. ...................................... 427/39; 437/170; 437/172; 437/225
[58] Field of Search ................... 427/39; 437/170, 172, 437/225

[56] References Cited

U.S. PATENT DOCUMENTS 4,333,814 6/1982 Kuyel ................................. 204/298
4,361,595 11/1982 Kaganowicz et al. ................ 427/39
4,466,380 8/1984 Jansen et al. ......................... 427/39
4,481,230 11/1984 Hanak .................................. 427/39

FOREIGN PATENT DOCUMENTS 0066787 12/1982 European Pat. Off. .

Primary Examiner—Bernard D. Pianalto
Attorney, Agent, or Firm—Armstrong, Nikaido, Marmelstein, Kubovcik & Murray

[57] ABSTRACT

An improved process for preparing a semiconductor layer by means of high frequency glow discharge generated between a ground electrode and a RF electrode, the improvement which comprises controlling a DC potential difference between the electrodes at a voltage of not more than 10 V. According to the process, the semiconductor layer formed on the RF electrode side is satisfactory in electrical and electronical properties, and can be practically used.

1 Claim, 4 Drawing Sheets

PROCESS FOR PREPARING SEMICONDUCTOR LAYER

BACKGROUND OF THE INVENTION

The present invention relates to an improved process for producing a semiconductor layer.

A semiconductor layer has hitherto been prepared with a high frequency glow discharger comprising, as shown in FIG. 9, an RF electrode 1 and a ground electrode 2 opposed thereto, by placing a substrate 3 on the ground electrode 2, generating a glow discharge between the electrodes while passing a gas containing the constituents of the semiconductor therebetween, decomposing the semiconductor constituents in the gas by glow discharge, and depositing them on the substrate. The electrodes are accommodated in a reaction chamber 21 and the RF electrode 1 is partially enclosed with an electrically shielded plate 20.

According to the conventional process, when a semiconductor layer is formed on the substrate 3 placed on the ground electrode 2, it is possible to simultaneously deposit another semiconductor layer on the RF electrode side. However, the semiconductor layer produced on the RF electrode side is insufficient in electrical and electronical properties such as a photoelectric conductivity and a doping characteristic, and cannot be put to practical use.

An object of the present invention is to provide an improved process for preparing a practicable semiconductor layer which is satisfactory in electrical and electronical properties such as a photoelectric conductivity and a doping characteristic on a substrate placed on the RF electrode, at the same time as a semiconductor layer is formed on a substrate placed on the ground electrode.

SUMMARY OF THE INVENTION

According to the present invention, there is provided an improved process for preparing a semiconductor layer including the steps of positioning opposed electrodes, passing a gas containing constituents of the semiconductor between the electrodes and applying a high frequency voltage across the electrodes, the improvement which comprises controlling a DC potential difference between the electrodes at a voltage of not more than 10 V.

DETAILED EXPLANATION

Figure 1:
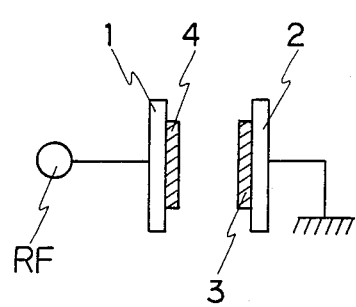
FIGS. 1 to 6 are schematic side views showing preferable embodiments of the electrode section of a high frequency glow discharger used in the present invention.

As an apparatus having opposed electrodes, used in the present invention, for producing semiconductor layers by applying a high frequency voltage, there can be employed a high frequency glow discharger having an electrode section shown in FIG. 1.

As shown in FIG. 1, not only is a substrate 3 placed on a ground electrode 2, but also a substrate 4 is placed on an RF electrode 1. To prevent powder and dust which are produced by electric discharge from sticking to the RF substrate, it is preferable to arrange the electrodes in vertical orientation. Semiconductor layers are formed on the substrates by high frequency glow discharge while passing a gas containing the constituents of the semiconductor between said electrodes. In this case, if the DC potential difference between the electrodes is controlled within ±10 V, preferable within ±5 V, a semiconductor layer is formed not only on the substrate 3 on the ground electrode 2 but also on the substrate 4 on the RF electrode 1, each semiconductor obtained being satisfactory in electrical and electronical properties such as a photoelectric conductivity and a doping characteristic and being practicable. Thus, the process of the invention using electrodes shown in FIG. 1 provides twice the film area produced by the conventional process. If said potential difference exceeds ±10 V, the localized density of state excessively to electronic or ionic damage, so that the semiconductor layer depositing on the substrate 4 on the RF electrode 1 is decreased in photoelectric conductivity and is lowered in doping efficiency. Thus, the semiconductor layer on the RF electrode side is insufficient in electrical and electronical properties and cannot be practically used.

Figure 2:
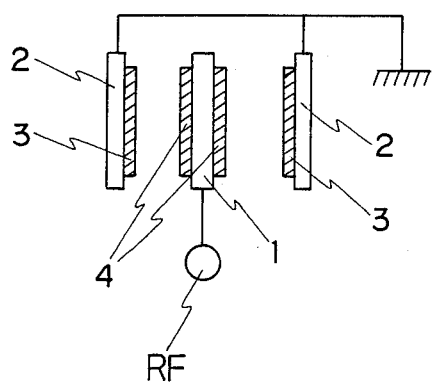
Figure 9:
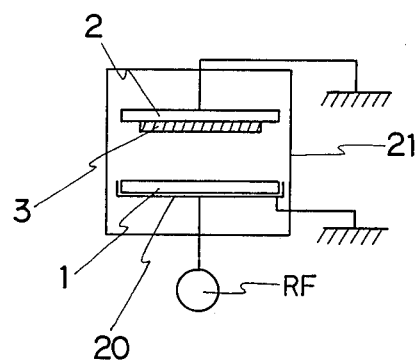
FIG. 9 is a schematic side view showing an electrode section of a conventional apparatus.

Another embodiment of an electrode section used in the present invention is shown in FIG. 2. In FIG. 2, an RF electrode 1 is positioned in the middle and ground electrodes 2 are positioned on opposite sides in parallel relation to the RF electrode. The use of the electrodes shown in FIG. 1 or FIG. 9 requires a shield to prevent electric discharge between the back side of the RF electrode 1 and chamber. Provision of such shield, however, leads to a drawback that the RF discharge becomes unstable. In case of the electrodes shown in FIG. 2, there is not necessary to use a shield and a stabilized glow discharge can be obtained. Therefore, even if the substrates 4 are not mounted on the RF electrode 1, twice the film area produced by the conventional process shown in FIG. 9 can be obtained. Further, if the substrates 4 are mounted on the RF electrode 1, four times the film area produced by the conventional process can be obtained.

In the apparatus shown in FIG. 2, the effect that any shield is not necessary can be attained even if the potential difference between the electrodes exceeds ±10 V. Therefore, the apparatus may be operated without mounting substrates on one or both surfaces of the RF electrode.

Figure 3:
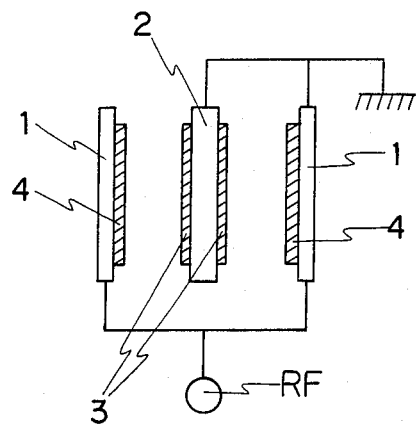
Figure 4:
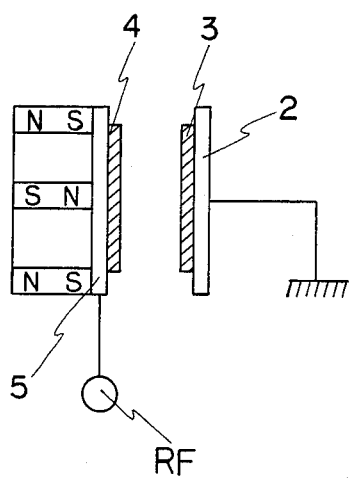

In an electrode section shown in FIG. 3 used in the present invention, a ground electrode 2 is positioned in the middle and RF electrodes 1 are provided on opposite sides thereof According to the apparatus shown in FIG. 3, as in case of FIG. 2, 2 to 4 times the film area produced by the conventional process can be obtained.

As shown in FIG. 4, there may be employed an apparatus which provides on the back surface of the RF electrode 5 with magnets. The magnets are arranged parallel with their N and S poles alternating with each other so as to produce a right-angled magnetic field with respect to the RF electric field. According to the apparatus, the growth rate of semiconductor layer on the substrate 4 placed on the RF electrode 5 is increased. If the DC potential difference is within 10 V, the distribution difference of film thickness of the semiconductor layer thus formed is extremely reduced, and a satisfactory semiconductor is obtained.

Figure 5:
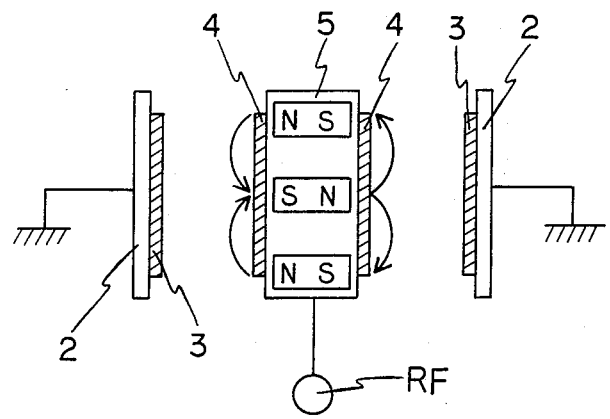
Figure 6:
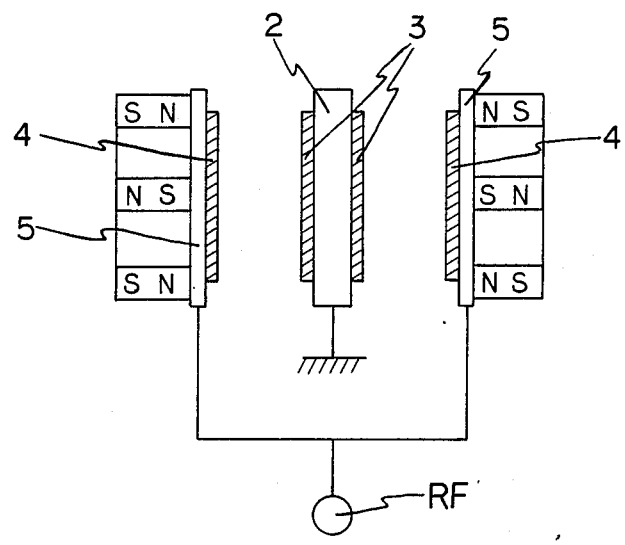

FIG. 5 shows an electrode section in which magnets are disposed within an RF electrode 5 in the electrode arrangement of FIG. 2 to produce a magnetic field, and FIG. 6 shows an electrode section in which magnets are disposed on the back surfaces of RF electrodes 5 in the electrode arrangement of FIG. 3 to produce a magnetic field.

The ground electrode may also be provided with magnets. The magnet may be a permanent magnet or an electromagnet, and the intensity of horizontally magnetic field is preferably 50 to 600 gausses on the surface of the substrate.

The distance between the neighbor electrodes used in the present invention is 15 to 80 mm, preferably 20 to 60 mm. If the electrode distance is less than 15 mm, electronic or ionic damage due to plasma increases and the film quality degrades, while if the electrode distance exceeds 80 mm, not only does the film growth rate lowers but also the substrate locates out of the gas decomposition region, which makes the film quality degrade.

The gas which contains the constituents of the semiconductor used in the invention is not particularly limited, but is a gas mixture comprising a gaseous compound containing elements such as Si, C, N, Ge and Sn. Examples of the gaseous compounds are, for instance, $SiH_4$, $SiF_4$, $GeH_4$, $GeF_4$, $Si_2H_6$, $SnH_4$, $NH_4$, a hydrocarbon such as $CH_4$ or $C_2H_6$, and the like. The gas mixture is used in a composition so as to form a desired semiconductor layer. The gas may be diluted with an inert gas such as $H_2$, He, Ar or $N_2$.

The gas mixture is flowed so that a pressure inside the discharger is generally 0.01 to 5 Torr, preferably 0.1 to 2 Torr. It should be noted, however, that the deposition pressure (semiconductor layer producing pressure) may be adjusted as well as the electrode area ratio and RF power (generally 0.001 to 0.5 W/cm$^2$, preferably 0.01 to 0.3 W/cm$^2$) so that the electrode potential difference has a predetermined value, or variable value by changing DC bias, and thus, the gas pressure is not limited to the above-mentioned range.

The substrate used in the present invention is preferably a substrate made of an electric insulator which allows radio frequency waves to pass therethough, such as ceramics, a glass or a polymer film. A substrate made of metal such as SUS, Ni, Fe or chromium may also be used when such substrate is electrically shielded or adhered to the electrode.

In the production of the semiconductor layer according to the process of the present invention, the substrate is heated generally at 25° to 800° C., and, in case of the production of an amorphous semiconductor layer, at 25° to 400° C. Heating method is not particularly limited, and may be employed a usual heating method.

As the high frequency wave used in the invention, a wave having a frequency in the order of not less than KHz, preferably not less than MHz, are desirable from a standpoint that ions are not moved by the electromagnetic wave. Application of a DC voltage to the RF electrode is performed preferably by the use of a floating power source.

In the present invention, when the composition of a gas mixture containing the constituents of the semiconductor to be passed between the electrodes is changed stepwise during the glow discharge procedure, a semiconductor layer thus formed has a laminar construction. According to the embodiment, a semiconductor having desired characteristics can be optionally produced.

According to the process of the present invention, an amorphous or crystalline semiconductor can be produced. The semiconductor can be used as a solar cell, TFT (thin film transistor), CCD (charge coupled device), and the like.

An embodiment of production manner of the semiconductor according to the process of the present invention will now be described with reference to the drawings.

Figure 7:
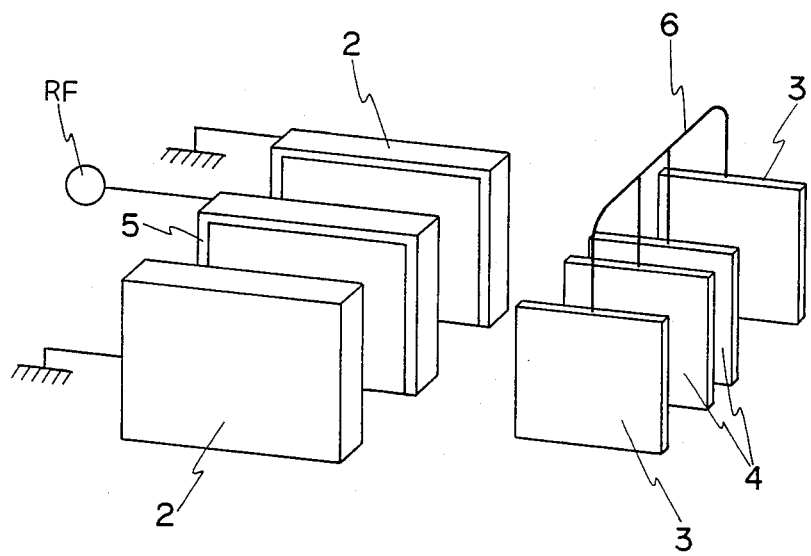
FIG. 7 is a schematic perspective view showing the movement of the substrates supported on the insulation supporter between the electrodes of the type shown in FIG. 5.

FIG. 7 shows a manner of movement of the substrates 3, 4 supported on an insulation support 6 between the electrodes 2, 5 disposed in the arrangement shown in FIG. 5. After the substrates are mounted on the electrodes 2, 5, semiconductor layers are formed by the glow discharge method.

Figure 8:
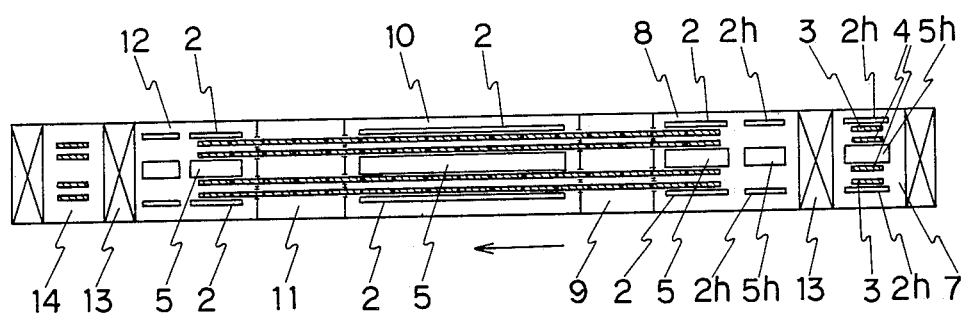
FIG. 8 is a schematic elevational view showing a preferable embodiment of an apparatus for mass-producing pin type semiconductor for a solar cell used in the present invention.

FIG. 8 shows an apparatus for mass-production of a pin type solar cell according to the process of the invention. The substrates 3, 4 are mounted on sheathed heaters 2h, 5h in a charing chamber 7, and are heated under vacuum. The heated substrates are transferred through a gate valve 13, in a manner of batch system, at a high speed into a p chamber 8, where a player is deposited on each substrate for the pin type solar cell. While the substrates are continuously moved through the p chamber 8, p type semiconductor layers are deposited on the substrates over the electrodes 2, 5 by the process of the present invention. Subsequently, the substrates are led through slits into a differential exhaust chamber 9. The gas which leaks from the p chamber 8 or an i chamber 10 is exhausted at the chamber 9. From the differential exhaust chamber 9 the substrates are led into the i chamber 10 where an i layer is formed, and there, i type semiconductor layers are deposited on the p layers formed on the substrates while the substrates are continuously moved. Then, the substrates are led through a differential exhaust chamber 11 into an n chamber 12 where an n layer is formed. The pin type semiconductors thus obtained are transferred through a gate valve 13 into a take-out chamber 14. After regulating the pressure in the chamber 14 to atmospheric pressure, the semiconductors are taken out of the chamber 14. The pressures in the chambers are set preferably so that i chamber > p chamber > n chamber > differential exhaust chambers to prevent the gases from mixing with each other. Particularly, the pressures in the differential exhaust chambers 9, 11 are not more than ½, preferably not more than 1/5 of the lowest pressure in the p chamber 8, the i chamber 10 or the n chamber 12. Since the semiconductor layers are formed while moving the substrates as described above, the semiconductor layers thus obtained have uniform thickness and distribution of quality.

The present invention is more particularly described and explained by means of the following Example. It is to be understood that the present invention is not limited to the Example and various changes and modifications may be made in the invention without departing from the spirit and scope thereof.

EXAMPLE

Four substrates of glass/transparent electrically conductive films were set on four surfaces of the electrodes in an apparatus having the electrode arrangement of FIG. 2. The DC potential difference between the electrodes was within ±2 V, and the frequency of the applied high frequency waves was 13.56 MHz. The temperature of the substrate was 200° C. Under those conditions, $SiH_4/CH_4$ (=3/7) gas containing 0.05% of $B_2H_6$ was used to deposit a p layer of 120 Å in thickness, and $SiH_4$ gas was used to deposit an i layer of 5000 Å in thickness, and $SiH_4$ gas containing 0.2% of $PH_3$ was used to deposit an n layer of 300 Å in thickness. On the n layer of each pin junction semiconductor thus obtained, an aluminum layer of 1 cm square was formed by vacuum evaporation method to give a solar cell.

The solar cells obtained were used to examine the V-I characteristic by a solar simulator of AM1 100 $mW/cm^2$. As a result, the conversion efficiencies o solar cells obtained from the RF electrode side were about 7%, and those of the solar cells obtained from the ground electrodes were about 7.5%.

In addition to the ingredients and the arrangement of the electrode section used in the Example, other ingredients and arrangements can be used in the Example as set forth in the specification to obtain substantially the same results.

What we claim is:

1. In a process for preparing a semiconductor layer including the steps of positioning opposed electrodes, passing a gas containing constituents of the semiconductor between the electrodes and applying a high frequency voltage across the electrode, the improvement which comprises controlling a DC potential difference between the electrodes at a voltage of not more than 5 V and providing a magnet on the surface of the electrode on which surface no semiconductor layer is formed.

* * * * *